United States Patent [19]

Lee

[11] Patent Number: 5,572,462

[45] Date of Patent: Nov. 5, 1996

[54] MULTISTATE PROM AND DECOMPRESSOR

[75] Inventor: Peter W. Lee, Saratoga, Calif.

[73] Assignee: Aplus Integrated Circuits, Inc., Saratoga, Calif.

[21] Appl. No.: 510,259

[22] Filed: Aug. 2, 1995

[51] Int. Cl.$^6$ .................................................. G11C 11/56
[52] U.S. Cl. ........................ 365/168; 365/185.03; 365/45
[58] Field of Search ........................ 365/168, 45, 185.03

[56] References Cited

U.S. PATENT DOCUMENTS

| | | | |
|---|---|---|---|
| 5,119,330 | 6/1992 | Tanagawa | 365/185.03 |
| 5,126,967 | 6/1992 | Simko | 365/45 |
| 5,262,984 | 11/1993 | Noguchi et al. | 365/185.03 |

*Primary Examiner*—Tan T. Nguyen
*Attorney, Agent, or Firm*—Flehr, Hohbach, Test, Albritton & Herbert

[57] ABSTRACT

A multistate PROM and decompressor comprises a PROM array including a plurality of cells arranged to have a plurality of wordlines and a plurality of bitlines, where each cell is configured to have one of a plurality of threshold voltages (Vt0-Vtn). A Vt-detector is coupled to the PROM array and configured to receive a high voltage wordline (WLHV) signal that is ramped from a first voltage (e.g. 0V or ground) to a second voltage (e.g. Vtmax). The Vt-detector is configured to compare the WLHV signal to a plurality of predetermined thresholds and to output a detector word in response to the WLHV signal. An addressed memory cell is selected by a wordline select signal and a bitline select signal. A wordline selector is coupled to the PROM array and configured to receive the WLHV signal. The wordline selector communicates the WLHV signal to a selected wordline in response to the wordline select signal. A bitline selector is coupled to the PROM array and configured to select a selected bitline carrying a bitline signal in response to the bitline select signal. A decompressor is coupled to the Vt-detector and the bitline selector and is configured to receive the detector word and the bitline signal. When the WLHV signal voltage meets the addressed cell's voltage threshold, the addressed memory cell is turned on and the selected bitline signal is activated. Then, the detector word is latched into the decompressor and the data stored in the addressed memory cell is delivered to an output terminal. The first embodiment can be combined with a pump generator. A pump generator delivers a relatively high voltage to the WLHV signal input in order to permit a greater expanse among the operational voltage or current levels. This feature increases the range over which the selectable voltages operate. An advantage of this approach is that there is a greater chance of correct interpretation by the Vt-detector and decompressor.

19 Claims, 9 Drawing Sheets

| CELL | CK3 | CK2 | CK1 | CK0 | Q1 | Q0 |
|------|-----|-----|-----|-----|----|----|
| ⎦ | 1 | 1 | 1 | 0 | 0 | 0 |
| ⎦ | 1 | 1 | 0 | 0 | 0 | 1 |
| ⎦ | 1 | 0 | 0 | 0 | 1 | 0 |
| ⎦ | 0 | 0 | 0 | 0 | 1 | 1 |

Q0=((CK0B*CK1B)(CK2B*CK3B+CK2*CK3))*CELL
Q1=((CK3*CK2B*CK1B)*CELL

| FIG. 7A | FIG. 7B |

| FIG. 8A | FIG. 8B |
|---|---|

MULTISTATE PROM AND DECOMPRESSOR

FIELD

The present invention relates to a multistate programmable read only memory (PROM) and decompressor. In particular, the multistate PROM and decompressor provide high density data storage in more than two states.

BACKGROUND

Most programmable read-only memory (PROM) cell arrays typically provide only two different states, which are interpreted respectively as a binary "1" or a binary "0". Another type of PROM cell arrays provide more than two states. The most popular of these arrays provide four states which are interpreted respectively as "00," "01," "11," and "10."

The two state PROM cell arrays consist of a single type of transistor that is either on or off, representing either a "1" or "0." This typically relates to a signal of 5 volts (V) for a "1" and 0 V for a "0." Four state PROM cell arrays have been developed where a representative voltage threshold level or current level difference is determined during fabrication of the transistor using techniques discussed below. When selected, the transistor of a four state PROM cell array operates at one of four voltage levels, representing the stored value. The voltage is delivered to a sensing amplifier which converts the threshold voltage to a digital bit word. One voltage level (Vt0) is associated with a logic "00," a second level (Vt1) with "01," a third level (Vt2) with "11," and a fourth level (Vt3) with "10."

To fabricate the multistate PROM cells, geometric techniques are known that involve laying out four transistors each having different source to drain widths, where the source to drain width determines the transistor voltage threshold. Of the four transistors, only one is actually connected: the one that represents the memory cell value. An example of such an array is U.S. Pat. No. 4,827,570. Other geometrical techniques are known to vary the size of the transistor's channel to obtain a plurality of possible outputs. An example of such an array is U.S. Pat. No. 4,192,014.

Doping techniques are also known that involve forming multistate cells by using a plurality of ion implant steps. For example, when four known types of implant steps are performed, four types of transistors result: an intrinsic transistor that receives no implant and has a threshold of 0 to 0.5 V; a standard enhancement transistor that receives a boron field implant and a compensating phosphorous implant and has a threshold of 0.5 to 1 volt; a high enhancement transistor that receives a boron implant and has a threshold of 1.5 to 2 V; and, a thick field transistor that has a threshold in excess of 15V. The PROM operates by activating a voltage ramp and determining how long it takes for the wordline to rise to the point where a sensing amplifier switches on. This technique requires relatively complex timing circuitry and internal delay lines. An example of such an array is Rich, et al., *A Four State ROM Using Multilevel Process Technology* (IEEE Journal of Solid-State Circuits, vol. SC-19, no. 2, April 1984).

Other examples employing multistate PROM techniques are described in U.S. patent applications titled "Multistate ROM Memory Cell Array," U.S. Ser. No. 08/242,695 filed May 13, 1994, Attorney docket No. A-59703-1 and "Flat-Cell ROM and Decoder," U.S. Ser. No. 08/279,682, filed Jul. 25, 1994, Attorney Docket No. A-59246-1, incorporated herein by reference.

One reason that multistate PROM technology has not become more commercialized is that the read cycle is difficult to perform. Many of the known devices employ complex timing techniques or close-ratio current sensing techniques for determining the PROM data. Complex timing techniques are problematic because they require excessive amounts of control circuitry. Close-ratio current sensing techniques are problematic because they compare the current loads of the various transistor types against one another.

In known close-ratio current sensing techniques, a comparison is made between a reference signal and a storage cell signal. This can be stated approximately by the equation $\Delta Vt/K$ where K is a function of the voltage Vt. For a small number of states, K is approximately linear, however, for a large number of states, e.g., 16 or greater, K becomes nonlinear. This causes instability in the sensing circuit and sensitivity to power supply noise. An example of a close-ratio analog memory technique is described in U.S. Pat. No. 5,126,967. In the '967 patent, one or more reference storage columns are included in the array at each side of the storage cell array and are used to store a reference signal at the same time that the adjacent storage cell stores a signal sample. On playback, the stored reference signals for the row of the array are read back and weighted relative to each other in accordance with the relative row position of the storage cell being simultaneously read. The '967 patent requires complex sensing circuitry to compare the differences between the reference signal and the storage cell signal.

SUMMARY

The present invention relates to a multistate programmable read only memory (PROM) and decompressor. In particular, the multistate PROM and decompressor provide data storage in more than two states.

A first embodiment of multistate PROM and decompressor comprises a PROM array including a plurality of cells arranged to have a plurality of wordlines and a plurality of bitlines, where each cell is configured to have one of a plurality of threshold voltages (Vt0-Vtn). A Vt-detector is coupled to the PROM array and configured to receive a high voltage wordline (WLHV) signal that is ramped from a first voltage (e.g. 0 V or ground) to a second voltage (e.g. Vtmax). The Vt-detector is configured to compare the WLHV signal to a plurality of predetermined thresholds and to output a detector word in response to the WLHV signal. An addressed memory cell is selected by a wordline select signal and a bitline select signal. A wordline selector is coupled to the PROM array and configured to receive the WLHV signal. The wordline selector communicates the WLHV signal to a selected wordline in response to the wordline select signal. A bitline selector is coupled to the PROM array and configured to select a selected bitline carrying a bitline signal in response to the bitline select signal. A decompressor is coupled to the Vt-detector and the bitline selector and is configured to receive the detector word and the bitline signal. When the WLHV signal voltage meets the addressed cell's voltage threshold, the addressed memory cell is turned on and the selected bitline signal is activated. Then, the detector word is latched into the decompressor and the data stored in the addressed memory cell is delivered to an output terminal.

The first embodiment can be combined with a pump generator. A pump generator delivers a relatively high voltage to the WLHV signal input in order to permit a greater expanse among the operational voltage or current levels.

This feature increases the range over which the selectable voltages operate. An advantage of this approach is that there is a greater chance of correct interpretation by the Vt-detector and decompressor.

Advantages of the present invention include high memory density and low power consumption. In the invention a comparison is made among the possible memory values by a Vt-detector circuit that measures $\Delta Vt/K$ where K is approximately 1 and is substantially linear. The efficiency achieved in the invention is attained primarily due to a novel Vt-detector and decompression circuit that permits PROM memory cells to store more information than previously possible.

BRIEF DESCRIPTION OF THE FIGURES

Additional advantages of the invention will become apparent upon reading the following detailed description and upon reference to the drawings, in which.

DETAILED DESCRIPTION

The present invention relates to a multistate programmable read only memory (PROM) and decompressor. In particular, the multistate PROM and decompressor provide data storage in more than two states.

The exemplary embodiments describe specific configurations. Those skilled in the art will appreciate that various changes and modifications can be made while remaining within the scope of the claims. For example, the invention can be used with any type ROM or PROM including EPROM, EEPROM, and FLASH memory. Moreover, the invention can employ any number of states such as 8, 10, 16, 20, 32 or more. All electrical parameters are given by example and can be modified with good results.

FOUR BY FOUR MULTISTATE PROM AND DECOMPRESSOR

A first embodiment is described with reference to FIGS. 1–6. A PROM and decompressor circuit is shown with reference numeral 10. A PROM array 12 is the location where the data is stored. In the invention, array 12 is constructed from a plurality of memory cells that each store information based on their respective predetermined threshold (Vt). Circuit 10 also includes a wordline selector 22 and a bitline selector 30 that operate based on addressed inputs X0, X1 and Y0, Y1 respectively. Selectors 22 and 30 identify the particular PROM memory cell that is to be read. A Vt-detector 40 and decompressor 50 serve to read the data contained in the addressed PROM memory cell. A Wordline High Voltage signal (WLHV) is voltage ramped and delivered to the addressed cell. When the addressed cell threshold is met, the bitline signal falls, decompressor 50 is activated and the data contained in the addressed cell is delivered to an output terminal.

Figure 2:
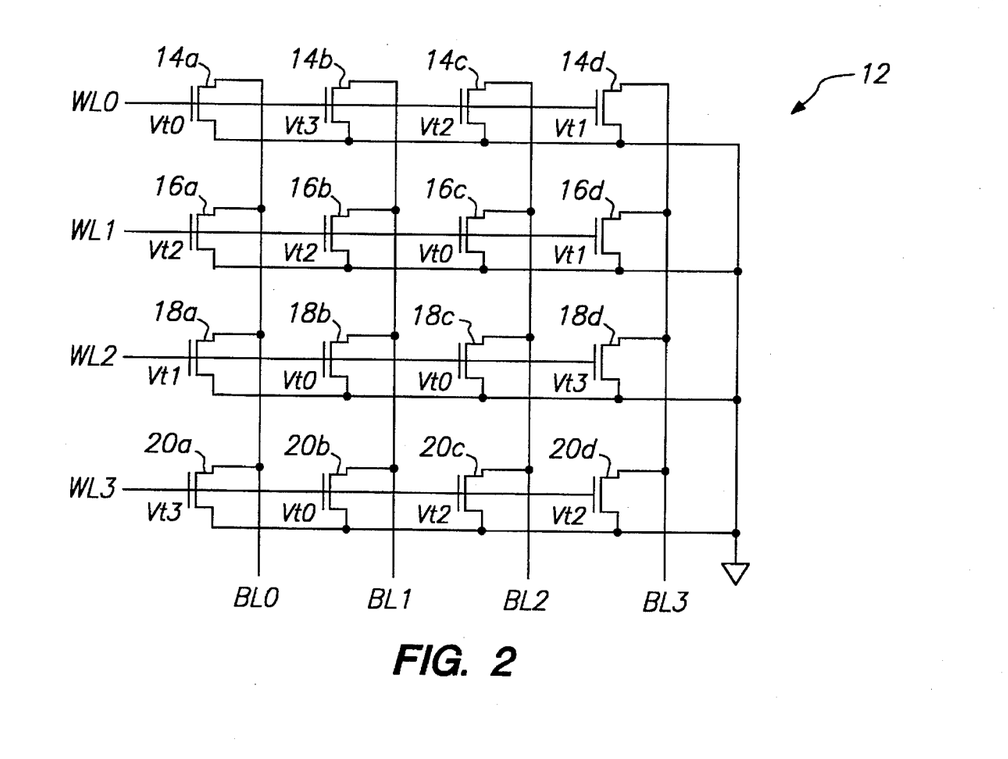
FIG. 2 depicts the PROM cell array of FIG. 1.

FIG. 2 depicts a four by four PROM array 12 according to the first embodiment. The PROM array transistors are arranged in wordlines commonly numbered and bitlines commonly lettered. Wordline zero (WL0) is memory cell transistors 14a–d, WL1 is memory cell transistors 16a–d, WL2 is memory cell transistors 18a–d, and WL3 is memory cell transistors 20a–d. Bitline zero (BL0) is memory cell transistors 14a, 16a, 18a, and 20a, BL1 is memory cell transistors 14b, 16b, 18b, and 20b, BL2 is memory cell transistors 14c, 16c, 18c, and 20c, and BL3 is memory cell transistors 14d, 16d, 18d, and 20d.

The embodiment is a four state PROM. Note that each memory cell transistor has an associated threshold Vt0, Vt1, Vt2, or Vt3. This threshold value represents the data stored by the memory cell transistor: one of four states. For example, state 0 can be considered "00," state 1 "01," state 2 "10," and state 3 "11." This data is read in conjunction with the selectors 22, 30 and the WLHV signal.

The data, stored as one of a plurality of thresholds, is read by a ramping WLHV signal. The WLHV signal is ramped from a first voltage (e.g. 0 V) to a second voltage (e.g., Vt3) over time. For purposes of generality, the greatest voltage threshold will be called Vtmax, in this case Vt3. At some point, the WLHV voltage will meet the voltage threshold of the selected memory cell. At that time, the memory cell will activate the bitline and the memory cell data will be communicated to an output terminal.

In a four state PROM, for example, Vt0 can be 0.7 V, Vt1 can be 2.1 V, Vt2 can be 3.6 V, and Vt3 can be 5V, where $\Delta Vt$ is approximately 1.4 V. Any number of voltage thresholds can be used in the invention (as described below). One feature of the invention is how the $\Delta Vt$ is substantially that same for all voltage thresholds. That is, Vt3-Vt2 is substantially equal to Vt2-Vt1, which is substantially equal to Vt1-Vt0. In this regard, the $\Delta Vt$ levels are substantially linear. As a result, an advantage of the invention is that since voltage levels can vary due to processing variations and age, a linear detection method assures high quality performance by consistently detecting the stored data.

In a slow mode such as a speech application, the invention can provide 6K read cycles per second, which is a read cycle every 166 µs. Other slow mode applications include hard disk or CD-ROM replacement. In a faster mode, the invention can support a read cycle for each possible state approximately every 200 ns, where the time required to generate each CK signal is less than 200 ns. This means that for a 16-state PROM, a complete read cycle for one wordline would take approximately 3.2 µs. In any case, the ramp speed of the WLHV signal should be slower than the time required to generate the detector word CK0–CK3. The number of cells in the wordline can be any number such as 4, 16, 1K or greater. To read multiple bitlines such as in a page read, multiple latches are required as described below with reference to FIG. 7.

Figure 3:
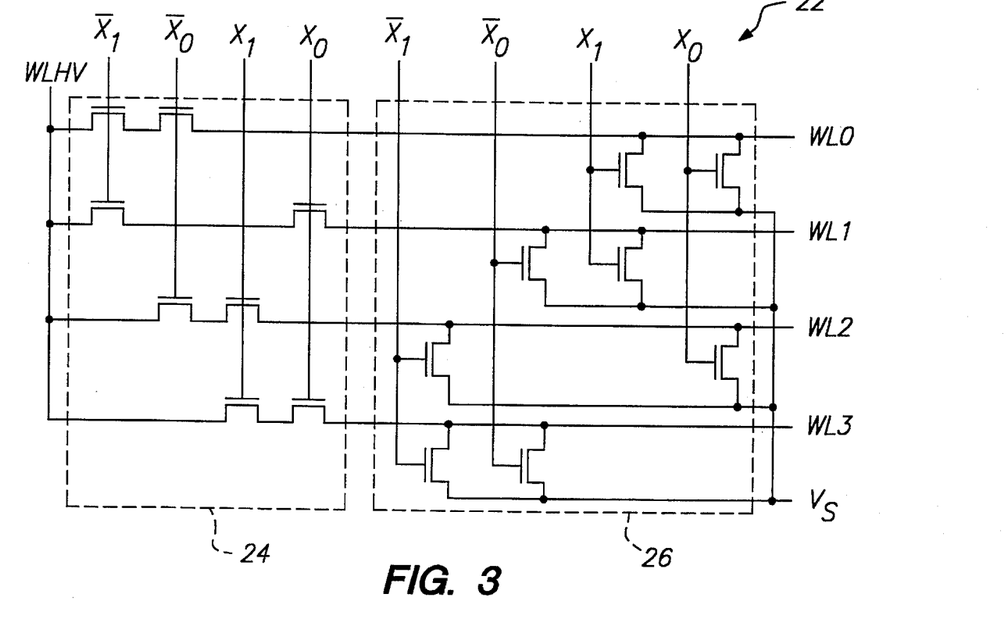
FIG. 3 depicts the wordline selector of FIG. 1.

FIG. 3 depicts wordline select 22. Wordline select 22 is composed of two circuits: an enable circuit 24 and a disable circuit 26. These two circuits are used in combination to avoid floating wordlines, on which the voltage is uncertain. Enable circuit 24 couples WLHV to a unique wordline based on the address inputs X0, X1. Disable circuit 26 couples all other wordlines to a support voltage (VS) signal. The following table 1 is shown for example:

TABLE 1

| X0 | X1 | Active WL |
|----|----|-----------|
| 0  | 0  | WL0       |
| 1  | 0  | WL1       |
| 0  | 1  | WL2       |
| 1  | 1  | WL3       |

Figure 7:
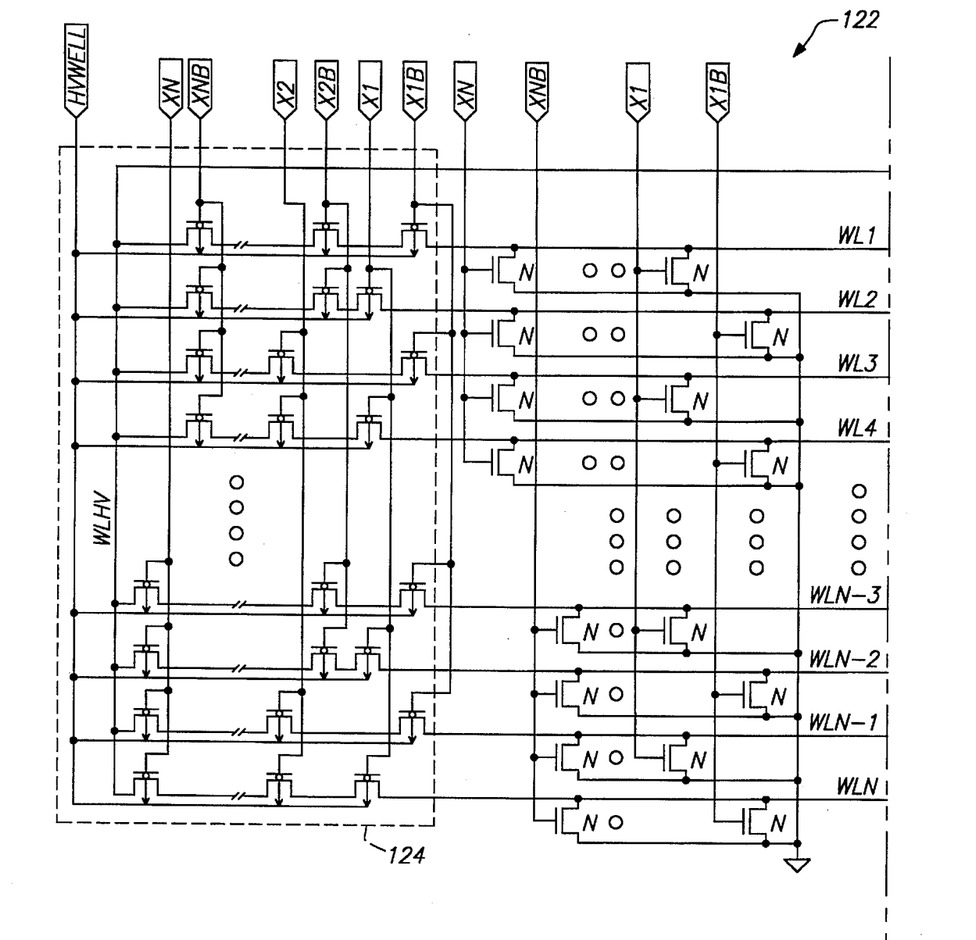
FIG. 7 is an overall diagrammatic view of a Multistate PROM and decompressor according to another embodiment of the invention.
Figure 7A:
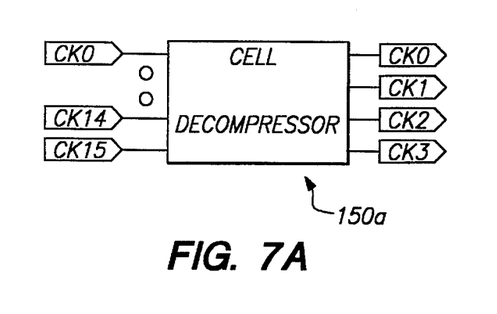
Figure 7B:
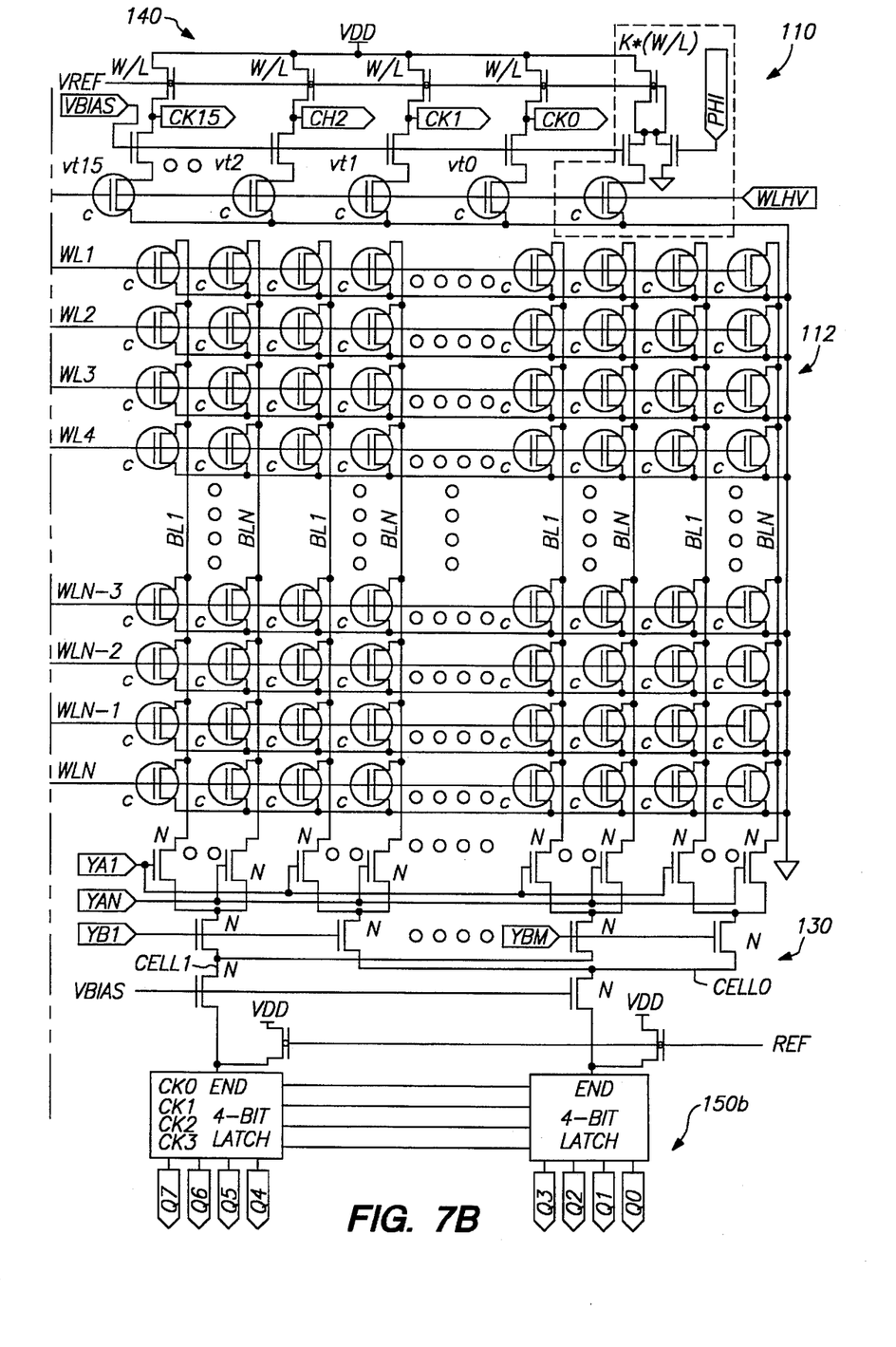

Transistor array 24 can be constructed of any type transistors, such as native n-channel transistors, enhancement n-channel transistors, or p-channel transistors (see FIG. 7 below). Transistor array 26 can be constructed of enhancement n-channel transistors. The VS signal is set to a voltage that prevents the inactive transistors in transistor array 24 from leaking current. If transistors 24 are native transistors, VS is set to approximately 0.5 V. If transistors 24 are enhancement transistors, VS is set to approximately 0 V.

When a WL is selected, X0 and X1 are selectively activated. In order to pass the full WLHV signal through the select transistor array 24, the voltage levels of the selectively activated X0 and X1 signals depend on the type of transistors in transistor array 24. If the transistors in array 24 are native transistors, then X0 and X1 are set to approximately Vtmax when affirmative. If the transistors in array 24 are enhancement transistors, then X0 and X1 are set to approximately Vtmax+1Vt when affirmative. This notation means that Vtmax+1Vt is equal to Vtmax plus one Vt, where Vt is the threshold voltage of an n-channel device (24) gated by X0 or X1 (e.g. 0.7 V). To achieve the Vtmax+1Vt voltage level either an external voltage source is available, or the voltage is pumped up as described below.

Figure 4:
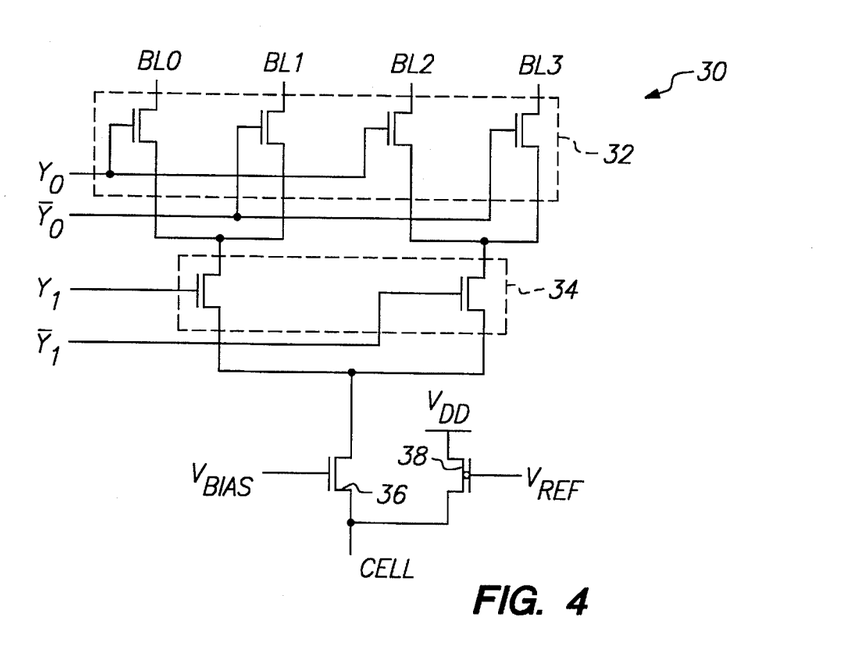
FIG. 4 depicts the bitline selector of FIG. 1.

FIG. 4 depicts bitline select 30. Inputs to the bitline select 30 serve to select the bitline as the CELL signal. Transistor 36 is disposed in the CELL signal line and the transistor gate is coupled to VBIAS. VBIAS is set to approximately 2 V, and is intended to suppress bitline voltage less than approximately 2 V-Vt. The suppression is to prevent excessive drain voltage that might potentially damage the PROM cells. One reason for VBIAS is that if a programmable PROM is used in the invention, excessive drain voltages may distort the PROM data. Transistor 38 supplies a high input signal that is pulled low when the addressed memory cell is selected, activating the CELL signal. The following table 2 is shown for example:

TABLE 2

| Y0 | Y1 | Active BL |
|----|----|-----------|
| 0  | 0  | BL3       |
| 0  | 1  | BL2       |
| 1  | 0  | BL1       |
| 1  | 1  | BL0       |

Figure 5:
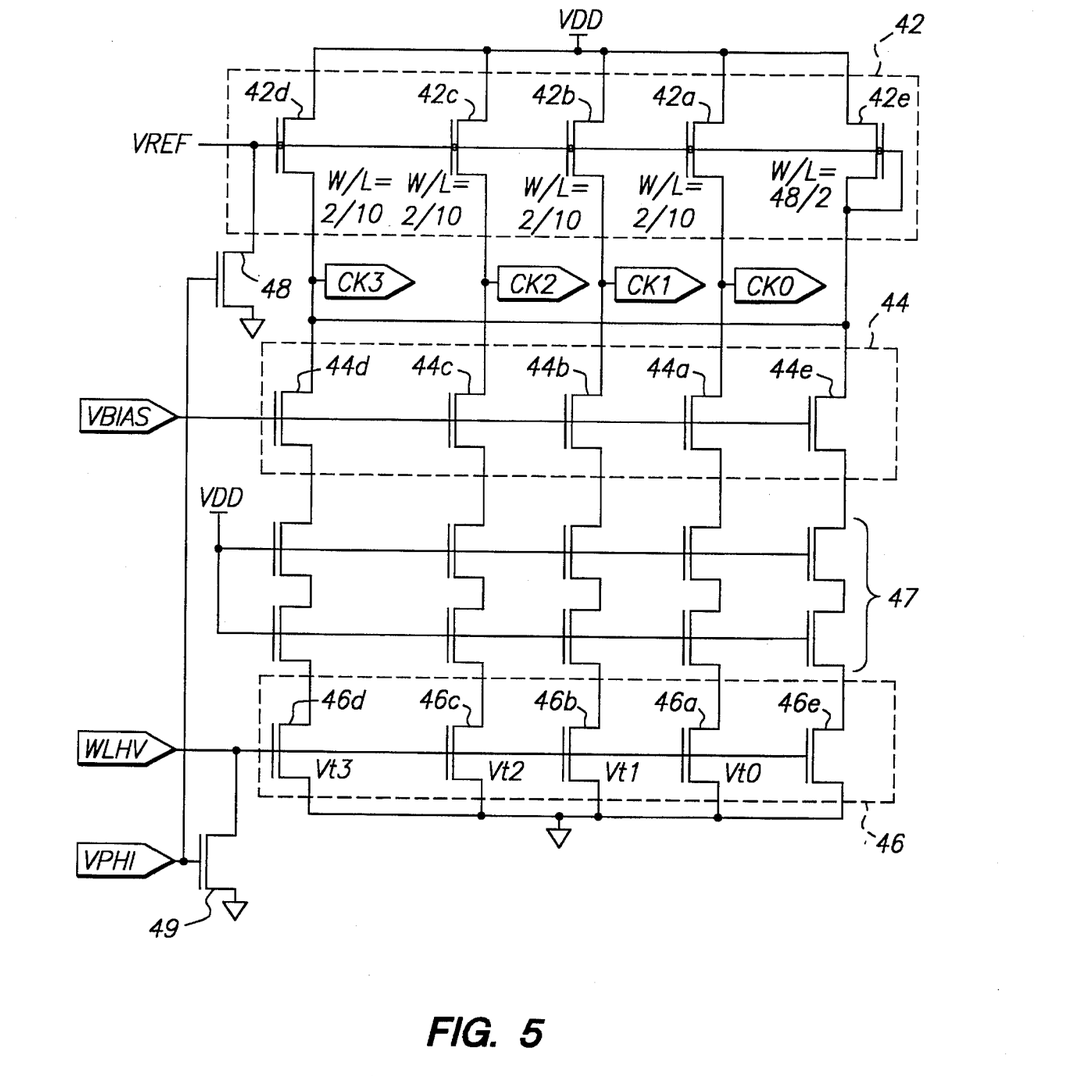
FIG. 5 depicts the detector of FIG. 1.

FIG. 5 depicts Vt-detector 40. Transistor array 42 is constructed from PMOS transistors to provide a high impedance couple to power (VDD). Note that the gates of the transistors in array 42 are coupled to the drain of a control transistor 42e. In essence, transistor array 42 behaves as a set of large impedance resistors. This is accomplished by constructing the transistors 42a–d with a low width to length ratio, for example 2/10, which results in a high impedance while using very little silicon real estate. For transistor 42e, a width to length ratio of 40/2 can be used. This results in a higher VREF voltage, which increases the gate voltage of transistors 42a–d to increase their impedances. This technique requires significantly less real estate than traditional resistors.

VBIAS is provided to transistor array 44 to suppress bitline voltage and is set to approximately 2 V. Transistor array 46 is provided to track the WLHV signal during the read cycle. During a read cycle, WLHV is ramped from a first voltage to a second voltage, such as from 0 V to 6 V. The CK signals are initially set to high. The CK signals represent a detector word. If the voltage thresholds are set to those described above, when WLHV reaches 0.7 V (Vt0), transistor 46a is turned on and the CK0 signal is activated low. When WLHV reaches 2.1 V (Vt1), transistor 46b is turned on and the CK1 signal is activated low. When WLHV reaches Vt2 (3.6 V), transistor 46c is turned on and the CK2 signal is activated low. And, when WLHV reaches 5 V (Vt3), transistor 46d is turned on and the CK3 signal is activated low. The CK0–CK3 signals are responsive to the WLHV signal voltage, and are sent to decompressor 50 as the detector word. The ramp speed of WLHV signal should be slower than the time required to generate the detector word CK0–CK3.

Transistor 46e is named a control transistor and is generally set to a low threshold (e.g., Vt0 or lower) because it is the transistor that controls the VREF signal. The VREF signal is controlled by the impedance difference between control transistor 42e and control transistor 46e, for example by the formula VREF=(R46e/(R42e+R46e))VDD where R42e is the impedance of transistor 42e and R46e is the impedance of transistor 46e. The VREF signal controls the impedance in the transistors of transistor array 42. When VREF is high, the transistors in array 42 are high impedance. When VREF is low, the transistors in array 42 are still relatively high impedance, but lower than the impedance when VREF is high.

Transistor array 47 is constructed in series with transistor arrays 42, 44 and 46. The purpose of transistor array 47 is to match the threshold tracking between Vt-detector circuit 40 and decompressor circuit 50. Referring back to FIG. 4, note that bitline selector 50 employs a two-level selector. That is, there are two transistor arrays 32, 34 in series with the bitlines BL0—BL3. Therefore, when a bitline is selected, the CELL signal will be a signal that passes from an addressed memory cell through two select transistor arrays 32, 34 and on to detector circuit 50. To insure proper tracking by Vt-detector 40, transistor array 47 is disposed in series with transistor array 46. In this embodiment transistor array 47 uses two transistors in series because bitline selector 30 also uses two select transistor arrays 32, 34 in series. When a bitline selector configuration employs a three-level selector, it is advantageous to design transistor array 47 to employ three transistors in series, and when a bitline selector configuration employs a J-level selector, it is advantageous to design transistor array 47 to employ J transistors in series.

Transistor 48 is an optional transistor that speeds up the read cycle. One natural result of a large resistance in transistor array 42 is that a large amount of time is required for the CK signals to return to their high state. To reduce the time required for the CK signals to return high, a VPHI signal is selectively activated for a short period of time to activate transistor 48 to reduce VREF for a short period of time to precharge the CK signals high. This is considered initializing the detector word. Transistor 49 is also incorporated in array 42 to set the WLHV signal low when VPHI is activated. This helps turn off transistor array 46 and the addressed cells in the selected wordline of PROM array 12 so that the selected bitline can be precharged without leakage. This is only performed when the WLHV is not active. For example, if the VPHI signal is derived from an address strobe and fed to a one-shot, every time the PROM is addressed the VPHI signal is selectively activated for a short period of time, such as for 1 μs and the CK signals are quickly set high. The actual period of the one shot depends on the selected bitline capacitance in PROM array 12 (since the capacitance in Vt-detector is small in comparison) and the load driving capability of the p-channel transistors gated by VREF. Alternatively, VPHI can be activated at the end of the read cycle so that the CK signals are set high in advance for the next read cycle.

Figure 6:
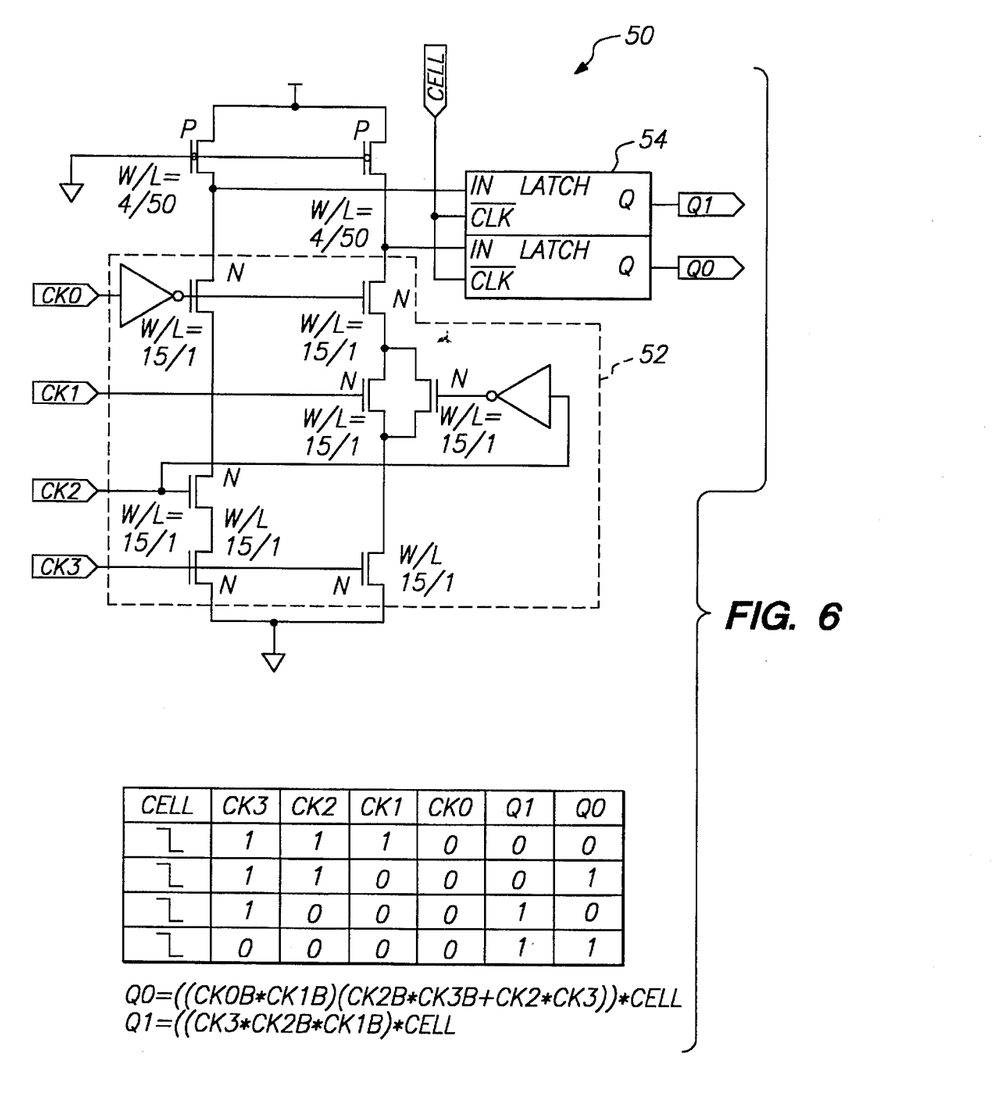
FIG. 6 depicts the decompressor of FIG. 1.

FIG. 6 depicts decompressor 50. Note that the CK0–CK3 inputs are delivered to a transistor array 52 that associates the CK0–CK3 signal inputs with a data value. Also note that data latch 54 receives the data value, which is stored at the falling edge of the clock input (CLK). This data is represented in the accompanying table in FIG. 6.

Figure 1:
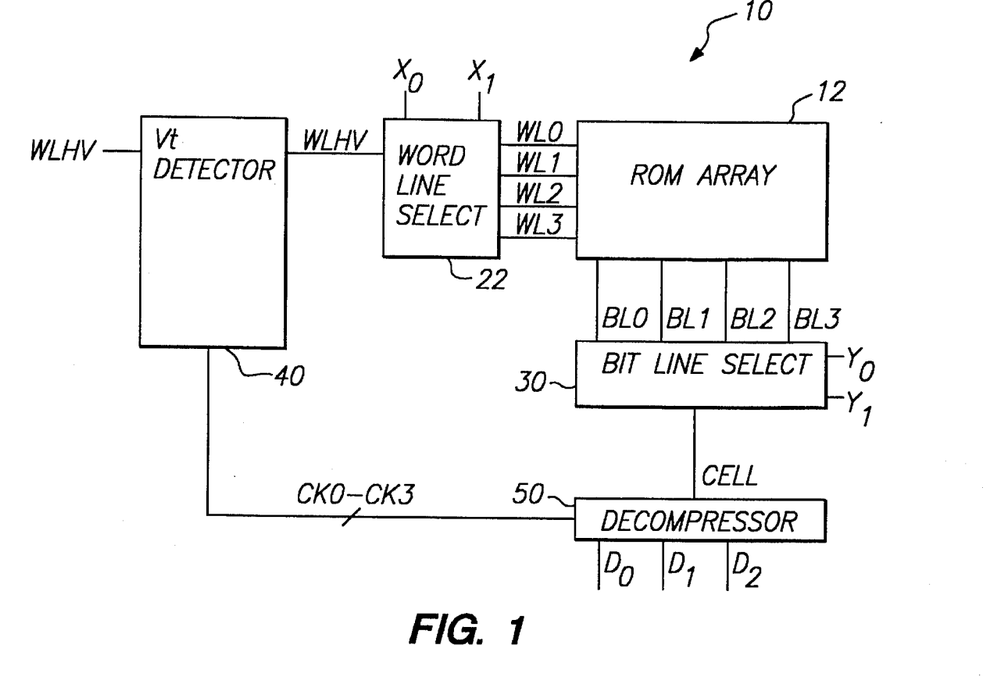
FIG. 1 is an overall diagrammatic view of a Multistate PROM and decompressor according to one embodiment of the invention.

In operation, when the PROM circuit 10 is selected, the various components work together to ramp WLHV signal from a first voltage (e.g., 0 V) to a second voltage (e.g., 6 V) and apply the WLHV signal to the addressed PROM cell. When the addressed PROM cell voltage threshold is met, the decompressor latches a data value that corresponds to the addressed PROM cell and outputs the data value to an output terminal.

In a four state PROM, for example, Vt0 can be 0.7 V, Vt1 can be 2.1 V, Vt2 can be 3.6 V, and Vt3 can be 5 V. The WLHV signal is ramped from 0 V to 6 V over a time period of 40 μs. Although the WLHV signal need only ramp to Vt2, since if the transistor did not turn on at Vt2, it would be Vt3, it is simpler in practice to ramp the WLHV signal above Vt3 to verify the Vt3 data. Once the read cycle is complete, the VREF signal recharges up close to VDD so that a new read cycle can begin. In a slow mode, the invention can provide 6K read cycles per second, which is a read cycle every 166 μs. In a faster mode, the invention can support a read cycle for each possible state every 1 μs. This means that for a 16-state PROM, a read cycle would take 16 μs, which applies to a single cell read, a wordline read, or a page read.

N BY M MULTISTATE PROM AND DECOMPRESSOR

Another embodiment of a PROM circuit 110 is described with reference to FIG. 7. Circuit 110 contains the similar basic components as Circuit 10. Additionally, circuit 110 demonstrates how the invention can be scaled to operate with any size PROM array 112. Note that Vt-detector 240 includes CK signals CK0 to CK15, which equates to a 16 state PROM. Also note wordline selector 222 select transistor array 224 is constructed from p-channel transistors.

In this embodiment, the n-well of the p-channel transistors is controlled by a HVNWELL signal. When the Xn select signals are applied to selector 122, the HVNWELL signal must be set to Vtmax+1 to avoid a forward bias in the source-drain junction.

Note that the 16 state PROM supports 4 data bits per cell. Therefore, to achieve a byte (8 bit) output, PROM array 112 is broken in to a lower word (low 4 bits) and a higher word (high 4 bits). The bitline select 130 is modified slightly to include a dual output so that two PROM cells are actually selected. This permits the bitline select 130 to output two CELL signals (CELL0 and CELL1) to a decompressor. CELL0 signal represents bits Q0–Q3 and CELL1 signal represents bits Q4–Q7.

Also note that the decompressor of the prior embodiment is constructed of decompressor 150a and latch 150b. In this embodiment, decompression is performed at Vt-detector 140 by decompressor 150a, and an encoded detector word is delivered to latch 150b. When the addressed memory cell's threshold is met, the bitline signal is activated and the bitline select CELL signal drops low. This causes the detector word to be latched by latch 150b and the data (Q0–Q7) is delivered to an output terminal.

Figure 8:
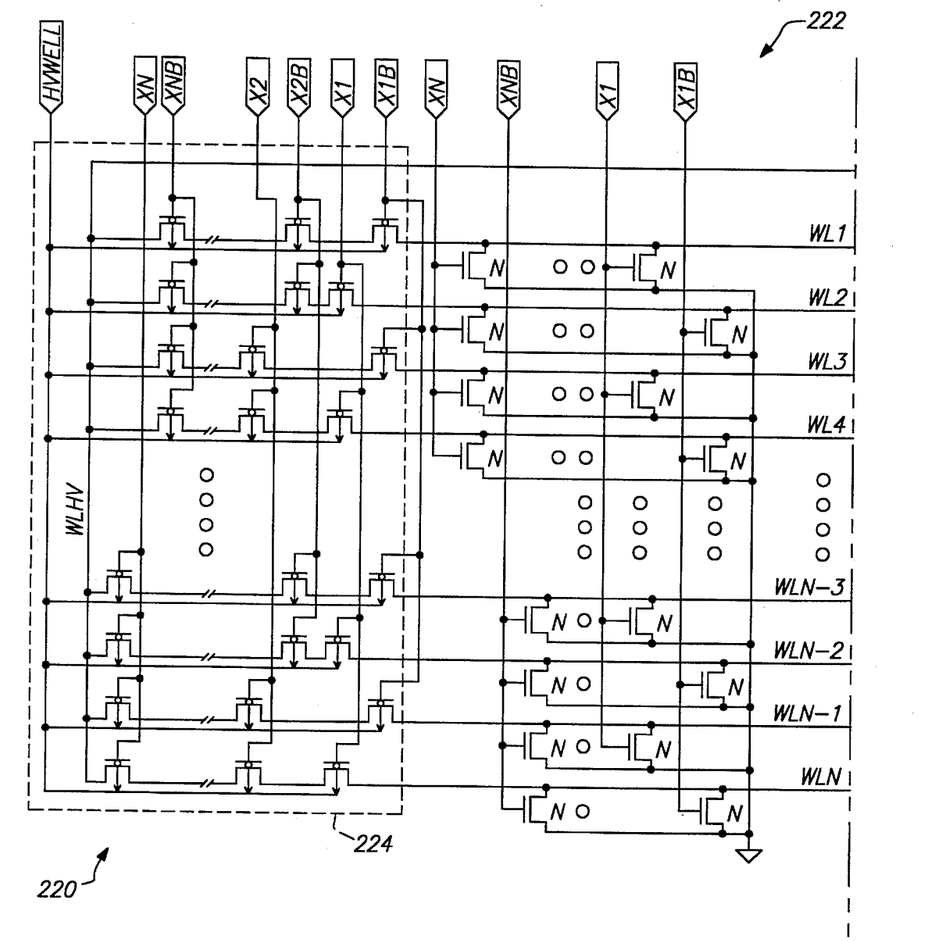
FIG. 8 is an overall diagrammatic view of a Multistate PROM and decompressor according to another embodiment of the invention.
Figure 8A:
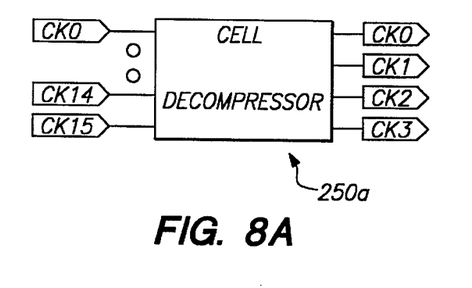
Figure 8B:
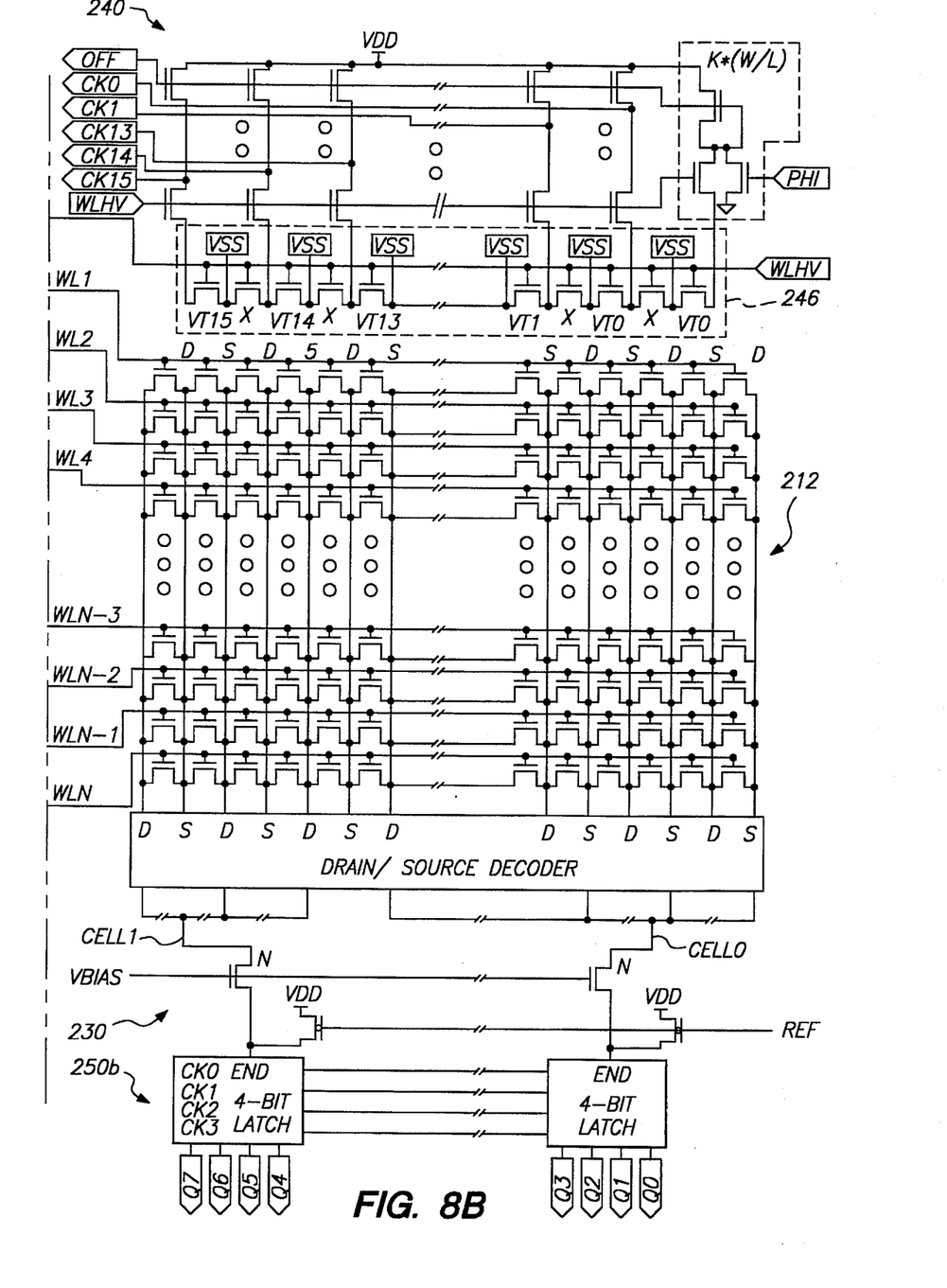

Another embodiment of a PROM circuit 210 is described with reference to FIG. 8. Circuit 210 contains the similar basic components as Circuit 10. Additionally, circuit 210 demonstrates how the invention can be scaled to operate with any size PROM array 212. Note that Vt-detector 240 includes CK signals CK0 to CK15, which equates to a 16 state PROM. Also note wordline selector 222 select transistor array 124 is constructed from p-channel transistors. HVNWELL signal. When the Xn select signals are applied to selector 222, the HVNWELL signal must be set to Vtmax+1 to avoid a forward bias in the source-drain junction.

Vt-detector 240 is constructed from an array of transistors in a manner similar to that in Vt-detector 40. Transistors 246 include active transistors that have a voltage threshold marked as Vt0–Vt15, and inactive transistors that are marked as X. The inactive transistors are achieved by, for example, heavy boron doping or masking of an active contact. This arrangement is so that adjacent transistors Vt0–Vt15 do not interfere with one another.

ROM array 212 is a memory array where the bitlines are controlled by drain/source decoder 230. In this embodiment, drain/source decoder 230 is a virtual ground decoder. Virtual ground decoders are known in the art, and an explanation is provided in "Multistate ROM Memory Cell Array," U.S. Ser. No. 08/242,695 filed May 13, 1994, Attorney docket No. A-59703-1 and "Flat-Cell ROM and Decoder," U.S. Ser. No. 08/279,682, filed Jul. 25, 1994, Attorney Docket No. A-59246-1.

Note that the 16 state PROM supports 4 data bits per cell. Therefore, to achieve a byte (8 bit) output, PROM array 212 is broken in to a lower word (low 4 bits) and a higher word (high 4 bits). The bitline select 230 is modified slightly to include a dual output so that two PROM cells are actually selected. This permits the bitline select 230 to output two CELL signals (CELL0 and CELL1) to a decompressor. CELL0 signal represents bits Q0–Q3 and CELL1 signal represents bits Q4–Q7.

Also note that the decompressor of the prior embodiment is constructed of decompressor 250a and latch 250b. In this embodiment, decompression is performed at Vt-detector 240 by decompressor 250a, and an encoded detector word is delivered to latch 250b. When the addressed memory cell's threshold is met, the bitline signal is activated and the bitline select CELL signal drops low. This causes the detector word to be latched by latch 250b and the data (Q0–Q7) is delivered to an output terminal.

EIGHT STATE DECOMPRESSOR

Figure 9:
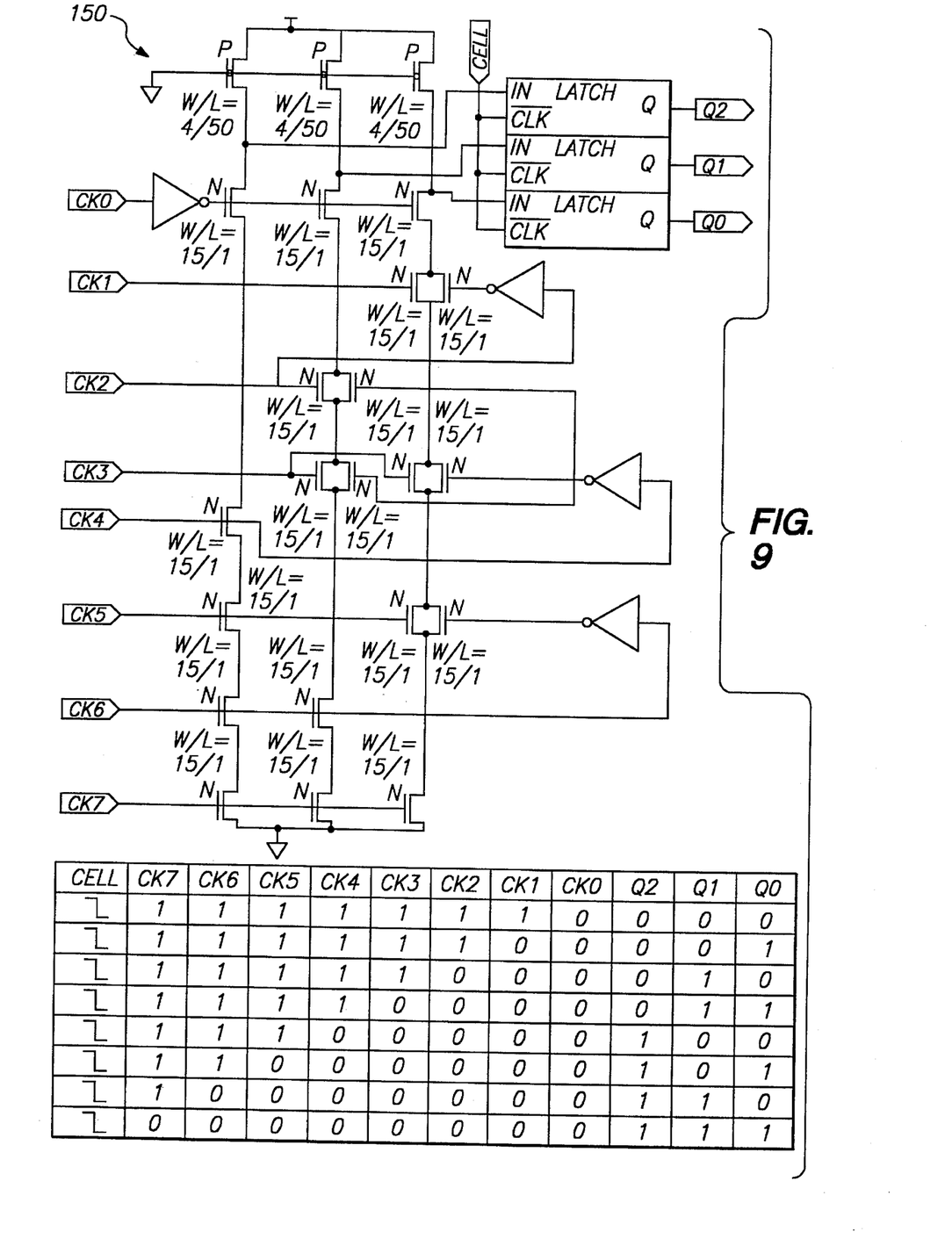
FIG. 9 depicts a decompressor according to another embodiment of the invention.

FIG. 9 depicts a decompressor for operation with an eight state PROM. This decompressor or similar to decompressor 50, but includes more states. This figure is shown to support the prior embodiments and to demonstrate an example of a higher order decompressor. Any size decompressor can work with the invention.

VOLTAGE AND CURRENT PUMPS

The disclosed embodiments assume that any necessary power level is supplied. However, the disclosed embodiments can be combined with a charge or voltage pump generator to increase the voltage beyond that supplied, i.e. from VDD to VPP. Charge and voltage pumps are known in the art and example is given by way of reference to U.S. Pat. Nos. 4,679,134 and 4,812,961.

The incorporation of a pump generator with the first embodiment expands the selectable voltages in order to facilitate improved yield and reliable retrieval of stored values: WLHV can be ramped up above VDD. As a practical matter, VDD is typically 1.5 V, 2.4 V, 4.5 V or other similar standard input. In a slow speed operation, the voltage can be pumped up to approximately 8 V. In a fast speed operation, the voltage can be pumped up to approximately 6 V. However, in either operation, these voltages can be varied with success. For example, in a 16 state EPROM, the voltage thresholds can be $Vt0=1.8$ V, $Vt1=2.1$ V, ... $Vt15=6.3$, where $\Delta Vt=0.3$ V. A 32 state PROM can be constructed where the voltage thresholds can be $Vt0=1.8$ V, $Vt1=1.95$ V, ... $Vt31=6.3$, where $\Delta vt=0.15$ V. A FLASH memory example can be $Vt0=1.0$ V, $Vt1=1.3$ V, ... $Vt15=5.5$, where $\Delta Vt=0.3$ V

CONCLUSION

Advantages of the present invention include high memory density and low power consumption. In the invention a comparison is made among the possible memory values by a Vt-detector circuit that measures $\Delta Vt/K$ where K is approximately 1 and is substantially linear. The efficiency achieved in the invention is attained primarily due to a novel Vt-detector and decompression circuit that permits PROM memory cells to store more information than previously possible.

Having disclosed exemplary embodiments and the best mode, modifications and variations may be made to the disclosed embodiments while remaining within the scope of the present invention as defined by the following claims.

What is claimed is:

1. A multistate PROM and decompressor comprising the combination of:
   a PROM array including a plurality of cells arranged to have a plurality of wordlines and a plurality of bitlines, where each cell is configured to have one of a plurality of threshold voltages;
   a Vt-detector coupled to the PROM array, said Vt-detector configured to receive a high voltage wordline (WLHV) signal, configured to compare the WLHV signal to a plurality of predetermined thresholds and configured to output a detector word in response to the WLHV signal;
   a wordline selector coupled to the PROM array, said wordline selector configured to receive the WLHV signal and configured to communicate the WLHV signal to a selected wordline in response to a wordline select signal;
   a bitline selector coupled to the PROM array, said bitline selector configured to select a selected bitline carrying a bitline signal in response to a bitline select signal;
   a decompressor coupled to said Vt-detector and said bitline selector and configured to receive said detector word and said bitline signal, and configured to generate a data signal when the bitline signal is activated.

2. The combination of claim 1, wherein said Vt-detector includes a plurality of transistors arranged in parallel where each parallel arrangement has a first transistor gated by the WLHV signal, a second transistor gated by a VBIAS signal, and a third transistor gated by a VREF signal.

3. The combination of claim 2, wherein said first transistor is an nmos transistor coupled to ground and said second transistor, said second transistor is an nmos transistor coupled to said first transistor and said third transistor, and said third transistor is a pmos transistor coupled to said second transistor and power.

4. The combination of claim 3, wherein said first transistor in each of said plurality of transistors arranged in parallel is one that has a threshold different than the other of said first transistors in said plurality of transistors arranged in parallel, and wherein said detector word is based on active first transistors responsive to the WLHV signal.

5. The combination of claim 4, wherein said Vt-detector further includes a transistor coupled to the VREF signal and gated by a VPHI signal wherein when said VPHI signal is activated, the VREF signal is pulled low.

6. The combination of claim 3, wherein said Vt-detector further includes a three control transistor series arranged in parallel with said transistors arranged in parallel, where said control transistor series has a first control transistor gated by the WLHV signal, a second control transistor gated by the VBIAS signal, and a third control transistor gated by the VREF signal, wherein said first control transistor is an nmos transistor coupled to ground and said second control transistor, said second control transistor is an nmos transistor coupled to said first control transistor and said third control transistor, and said third control transistor is a pmos transistor coupled to said second control transistor and power, and wherein said VREF signal is derived from a signal from the coupling of said second control transistor and said third control transistor.

7. The combination of claim 6, wherein said first transistor in each of said plurality of transistors arranged in parallel is one that has a threshold different than the other of said first transistors in said plurality of transistors arranged in parallel, and wherein said detector word is based on active first transistors responsive to the WLHV signal.

8. The combination of claim 7, wherein said Vt-detector further includes a transistor coupled to the WLHV signal and gated by a VPHI signal wherein when said VPHI signal is activated, the WLHV signal is pulled low.

9. The combination of claim 1, wherein said wordline selector includes an enable circuit and a disable circuit.

10. The combination of claim 9, wherein said enable circuit includes a plurality of transistors that enable a selected wordline in response to said wordline select signal, and said disable circuit includes a plurality of transistors that disable all wordlines except said selected wordline in response to said wordline select signal.

11. The combination of claim 1, further including:
    a pump generator for generating a pump voltage and supplying said pump voltage to said memory cell array, said pump voltage being beyond an input voltage range.

12. A method of manufacturing a PROM comprising the steps of:
    forming a PROM array having multiple memory storage locations with a plurality of voltage thresholds;
    coupling a wordline selector to said PROM;
    coupling a bitline selector to said PROM;
    coupling a Vt-detector to said wordline selector; and
    coupling a decompressor to said PROM and to said Vt-detector.

13. A method of retrieving information from a multistate PROM comprising the steps of:
    generating a detector word responsive to a wordline high voltage (WLHV) signal, the WLHV signal ramping from a first voltage to a second voltage during a predefined time;

communicating the WLHV signal to a wordline selector;

selecting a wordline based on a wordline select signal and communicating the WLHV signal to the selected wordline;

selecting a bitline based on a bitline select signal;

sensing when the selected bitline is activated in response to the WLHV signal; and when the selected bitline is activated, generating a data output responsive to the detector word.

14. The method of claim 13, wherein said step of generating a detector word comprises the steps of:

comparing the WLHV signal against a plurality of thresholds; and changing the detector word the WLHV signal passes each of the plurality of thresholds.

15. The method of claim 14, wherein said step of generating a detector word further comprises the step of:

precharging the detector word before performing said step of activating a WLHV signal.

16. The method of claim 15, wherein said step of generating a detector word further comprises the step of:

precharging the selected bitline before performing said step of activating a WLHV signal.

17. The method of claim 13, wherein said step of generating a detector word comprises the steps of:

comparing the WLHV signal against a plurality of thresholds; and changing an independent bit in the detector word when the WLHV signal passes each of the thresholds.

18. The method of claim 13, wherein said step of selecting a wordline comprises the steps of:

enabling a wordline based on the wordline select input; and disabling all other wordlines based on the wordline select input.

19. The method of claim 18, wherein said step of selecting a wordline further comprises the step of:

preventing leakage current by providing a support voltage signal to the disabled worlines.

* * * * *